(12) United States Patent
Hur et al.

(10) Patent No.: US 11,344,915 B2
(45) Date of Patent: May 31, 2022

(54) ULTRASONIC WAVE AMPLIFYING UNIT AND NON-CONTACT ULTRASONIC WAVE TRANSDUCER USING SAME

(71) Applicant: CENTER FOR ADVANCED META-MATERIALS, Daejeon (KR)

(72) Inventors: Shin Hur, Sejong-Si (KR); Jun Ho Jeong, Daejeon (KR); Kyung Jun Song, Daejeon (KR); Hak Joo Lee, Daejeon (KR); Jong Jin Park, Sejong-Si (KR); Jun Hyuk Kwak, Daejeon (KR)

(73) Assignee: CENTER FOR ADVANCED META-MATERIALS, Daejeon (KR)

( * ) Notice: Subject to any disclaimer, the term of this patent is extended or adjusted under 35 U.S.C. 154(b) by 0 days.

(21) Appl. No.: 17/054,151

(22) PCT Filed: Jun. 19, 2019

(86) PCT No.: PCT/KR2019/007372
§ 371 (c)(1),
(2) Date: Nov. 9, 2020

(87) PCT Pub. No.: WO2020/004856
PCT Pub. Date: Jan. 2, 2020

(65) Prior Publication Data
US 2021/0086230 A1 Mar. 25, 2021

(30) Foreign Application Priority Data
Jun. 29, 2018 (KR) .................. 10-2018-0075904

(51) Int. Cl.
*B06B 1/02* (2006.01)
*B06B 3/02* (2006.01)
(Continued)

(52) U.S. Cl.
CPC .................. *B06B 1/02* (2013.01); *B06B 3/02* (2013.01); *G01N 29/348* (2013.01); *H03B 5/12* (2013.01)

(58) Field of Classification Search
CPC .. B06B 1/02; B06B 3/02; B06B 1/067; B06B 1/0269; G01N 29/348; G01N 2291/0231;
(Continued)

(56) References Cited

U.S. PATENT DOCUMENTS

2001/0007591 A1 7/2001 Pompei
2007/0154036 A1* 7/2007 Matsuzawa ............ H04R 1/403
381/116

FOREIGN PATENT DOCUMENTS

JP  2000-050392 A  2/2000
JP  2000050392 A  *  2/2000  ............ B06B 1/0292
(Continued)

OTHER PUBLICATIONS

International Search Report for PCT/KR2019/007372 dated Sep. 24, 2019 from Korean Intellectual Property Office.

*Primary Examiner* — Peter J Macchiarolo
*Assistant Examiner* — John M Royston
(74) *Attorney, Agent, or Firm* — Revolution IP, PLLC (57) ABSTRACT

An embodiment of the present invention provides an ultrasonic wave amplifying unit which can improve ultrasonic power in air, wherein the ultrasonic wave amplifying unit includes multiple rings having a concentric axis and each having a first width, and a slit having a second width is formed between the rings and an air layer is formed between the multiple rings and an ultrasonic wave generator generating ultrasonic waves or a transfer medium transferring the ultrasonic waves.

10 Claims, 8 Drawing Sheets

(51) Int. Cl.
*G01N 29/34* (2006.01)
*H03B 5/12* (2006.01)

(58) Field of Classification Search
CPC ............. G01N 29/2456; G01N 29/226; G01N 29/0672; H03B 5/12
See application file for complete search history.

(56) References Cited

FOREIGN PATENT DOCUMENTS

| | | | |
|---|---|---|---|
| JP | 2005-223820 A | | 8/2005 |
| JP | 2005223820 A | * | 8/2005 |
| JP | 2009-177302 A | | 8/2009 |
| KR | 10-2016-0008280 A | | 1/2016 |
| KR | 10-2016-0020208 A | | 2/2016 |
| KR | 20160020208 A | * | 2/2016 |

* cited by examiner

Enlarged view of region C

Pulse signal

ULTRASONIC WAVE AMPLIFYING UNIT AND NON-CONTACT ULTRASONIC WAVE TRANSDUCER USING SAME

TECHNICAL FIELD

The present invention relates to an ultrasonic wave amplifying unit and a non-contact ultrasonic transducer using the same. More particularly, the present invention relates to an ultrasonic wave amplifying unit which can improve ultrasonic power in air, and a non-contact ultrasonic transducer using the same.

BACKGROUND ART

An ultrasound apparatus, for example, an ultrasonic testing apparatus, radiates ultrasonic waves to a subject, such as humans, animals, or objects, detects echo signals reflected from the subject, and displays a tomographic image of tissue in the subject on a monitor to provide information necessary for inspection of the subject.

Ultrasonic testing can be roughly divided into a contact ultrasonic test and a non-contact ultrasonic test. The contact ultrasonic test is a testing method in which ultrasonic waves are transmitted/received using water or a couplant as a medium, and is widely used in the related art.

The non-contact ultrasonic test is a testing method test in which ultrasonic waves are transmitted/received using air (atmosphere) as a medium, instead of water or a couplant, and is also referred to as an air-coupled ultrasonic test.

The air-coupled ultrasonic test is a testing method that is easy to apply to porous materials such as composite materials, and mainly uses low frequency ultrasonic waves (50 kHz to 500 kHz) due to severe attenuation of ultrasonic waves. A transducer used in this testing method is an air-coupled ultrasonic transducer. The air-coupled ultrasonic test is mainly applied to the field of non-destructive inspection of composite materials used as a material for aerospace structures and buildings.

In a general contact ultrasonic test, since scanning is performed with water or a liquid placed between a transducer and a surface to be scanned, a subject is often exposed to the water or the liquid. In addition, when the subject has fine irregularity or tissue on the surface thereof or when the subject is a fibrous material, it is difficult to use the contact ultrasonic test. Conversely, the air-coupled ultrasonic test is carried out without direct contact with a surface to be tested and thus can prevent contamination of the subject. Thus, the air-coupled ultrasonic test is advantageously used to inspect a subject to which immersion testing is not applicable, such as wood, paper, porous materials, and materials having high temperature.

However, due to a difference in impedance between air and a target material, the air-coupled ultrasonic test has a drawback of reduction in amount of wave energy penetrating the target material, as compared with an ultrasonic test using water or a couplant as a medium. That is, the air-coupled ultrasonic test obtains ultrasonic signals having smaller power or having a smaller signal-to-noise ratio than those obtained by the ultrasonic test using water or couplant as a medium. In addition, the air-coupled ultrasonic test has a drawback of a lower resolution due to use of lower frequency ultrasonic waves than the contact ultrasonic test.

Therefore, in order to improve performance of the air-coupled ultrasonic test, it is necessary to amplify ultrasonic signals transmitted/received by the air-coupled ultrasonic transducer.

DISCLOSURE

Technical Problem

It is one object of the present invention to provide an ultrasonic wave amplifying unit which can improve ultrasonic power in air, and a non-contact ultrasonic transducer using the same.

The above and other objects of the present invention will become apparent to those skilled in the art from the detailed description of the following embodiments in conjunction with the accompanying drawings.

Technical Solution

In accordance with one aspect of the present invention, there is provided an ultrasonic wave amplifying unit including multiple rings having a concentric axis and each having a first width, wherein a slit having a second width is formed between the rings and an air layer is formed between the multiple rings and an ultrasonic wave generator generating ultrasonic waves or a transfer medium transferring the ultrasonic waves, whereby ultrasonic amplification is achieved using both resonance occurring due to the slit and resonance occurring due to the air layer.

The ultrasonic wave amplifying unit may further include a connection bar extending in a diametrical direction of the multiple rings to connect the multiple rings to one another.

In the ultrasonic wave amplifying unit, each of the rings may have a spacer protruding from a back surface thereof such that the rings are spaced apart from the ultrasonic wave generator or the transfer medium to form the air layer therebetween.

In the ultrasonic wave amplifying unit, the spacer may include multiple spacers radially arranged on each of the rings.

In the ultrasonic wave amplifying unit, the spacer may include multiple spacers circumferentially extending on each of the rings and arranged at predetermined intervals based on an operational frequency of the ultrasonic waves.

In the ultrasonic wave amplifying unit, the spacer may protrude to a height less than $1/100$ of the operational wavelength ($\lambda$) of the ultrasonic waves.

In the ultrasonic wave amplifying unit, each of the rings may have a circular shape or a rectangular shape.

In the ultrasonic wave amplifying unit, front surfaces of the multiple rings may form a continuous concave surface and back surfaces of the multiple rings may form a continuous convex surface such that the ultrasonic waves amplified and radiated by the ultrasonic wave amplifying unit are concentrated on a first point in front of the ultrasonic wave amplifying unit.

The ultrasonic wave amplifying unit may be configured to have a second resonant frequency different from an operational frequency of the ultrasonic waves, whereby, through coupling between the operational frequency and the second resonant frequency, a broadband ultrasonic wave having a second bandwidth larger than a first bandwidth of the operational frequency is formed and an ultrasonic signal is modified to have a second pulse width smaller than a first pulse width of the operational frequency.

In accordance with another aspect of the present invention, there is provided a non-contact ultrasonic transducer including: an ultrasonic vibration portion generating ultrasonic waves; a matching layer disposed on a front surface of the ultrasonic vibration portion and radiating the ultrasonic waves generated by the ultrasonic vibration portion in a forward direction thereof; an absorption portion disposed on a back surface of the ultrasonic vibration portion and absorbing the ultrasonic waves generated by the ultrasonic vibration portion; and the ultrasonic wave amplifying unit according to any one of claims 1 to 9.

The non-contact ultrasonic transducer may further include: a casing surrounding outer peripheral surfaces of the ultrasonic vibration portion and the matching layer and having a front end tightly contacting a back surface of the ultrasonic wave amplifying unit; and a clamping portion including a housing surrounding an outer peripheral surface of the casing and a flange extending from a front end of the housing toward a center of the housing and tightly contacting a front edge of the ultrasonic wave amplifying unit to tightly secure the ultrasonic wave amplifying unit to the matching layer.

Advantageous Effects

According to the present invention, the ultrasonic wave amplifying unit may have a first resonant frequency identical to the operational frequency of ultrasonic waves radiated from the matching layer. Accordingly, when ultrasonic waves having an operational frequency identical to the first resonant frequency are applied to the ultrasonic wave amplifying unit, a resonance can be generated in the ultrasonic wave amplifying unit, causing amplification of the ultrasonic waves and thus increase in ultrasonic power in air.

In addition, the first resonant frequency of the ultrasonic wave amplifying unit may be designed by adjusting the first width of the ring, the second width of the slit, the thickness of the air layer, and the height of the spacer, thereby facilitating design of the first resonant frequency.

Further, the ultrasonic wave amplifying unit may have a second resonant frequency different from the operational frequency so as to form broadband ultrasonic waves. In this way, it is possible to reduce the pulse width of ultrasonic signals radiated from the matching layer.

Furthermore, with the spacer formed on one surface of the ultrasonic wave amplifying unit, the ultrasonic wave amplifying unit may be detachably connected to an existing non-contact ultrasonic transducer.

It will be understood that advantageous effects of the present invention are not limited to the above and include any advantageous effects conceivable from the features disclosed in the detailed description of the invention or the appended claims.

BEST MODE

Reference will now be made in detail to various embodiments, examples of which are illustrated in the accompanying drawings. It should be understood that the present invention may be embodied in different ways and is not limited to the following embodiments. In the drawings, portions irrelevant to the description will be omitted for clarity. Like components will be denoted by like reference numerals throughout the specification.

Throughout the specification, when an element or layer is referred to as being "on," "connected to," or "coupled to" another element or layer, it may be directly on, connected to, or coupled to the other element or layer or intervening elements or layers may be present. In addition, unless otherwise stated, the term "includes" should be interpreted as not excluding the presence of other components than those listed herein.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, embodiments of the present invention will be described in detail with reference to the accompanying drawings.

Figure 1:
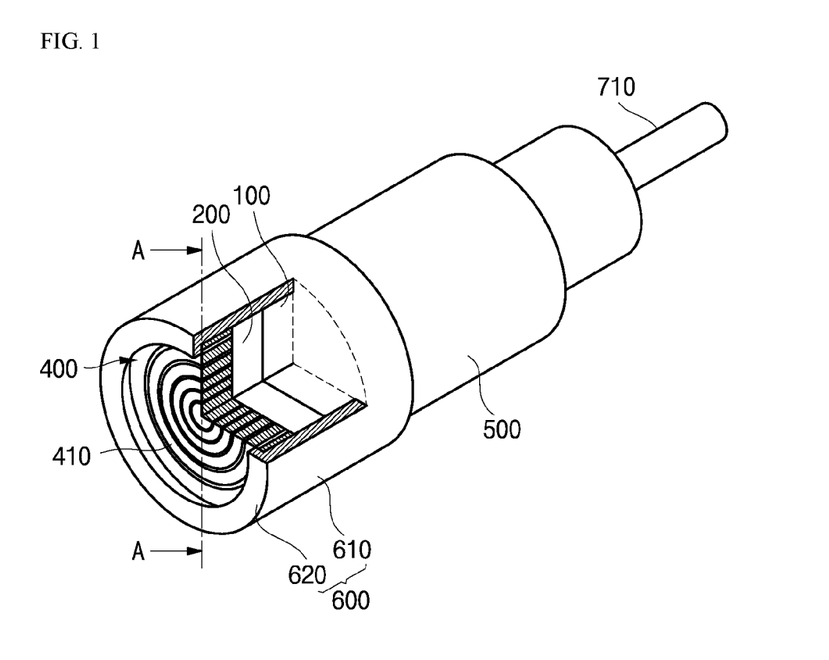
FIG. 1 is a perspective view of a non-contact ultrasonic transducer according to one embodiment of the present invention.
Figure 2:
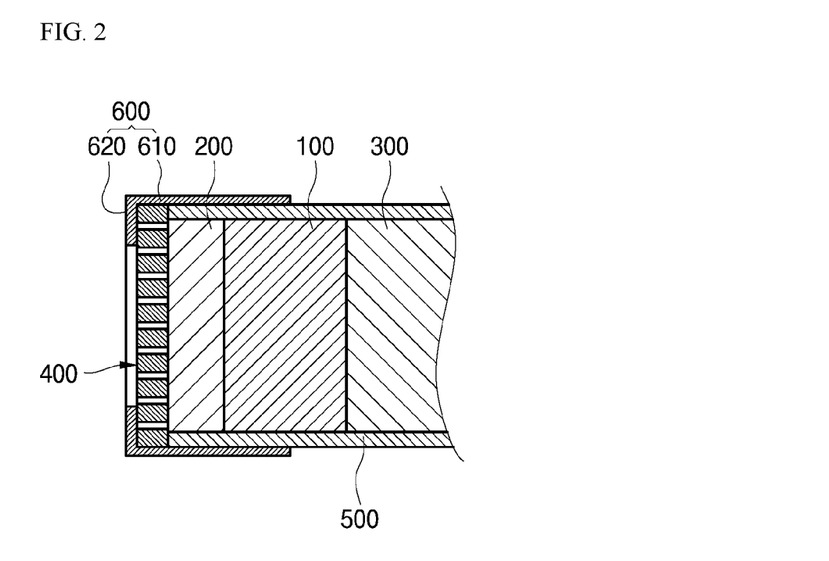
FIG. 2 is a sectional view taken along line A-A of FIG. 1.

FIG. 1 is a perspective view of a non-contact ultrasonic transducer according to one embodiment of the present invention, and FIG. 2 is a sectional view taken along line A-A of FIG. 1.

Referring to FIG. 1 and FIG. 2, the non-contact ultrasonic transducer may include an ultrasonic vibration portion 100, a matching layer 200, an absorption portion 300, and an ultrasonic wave amplifying unit 400.

Here, the ultrasonic vibration portion 100, the matching layer 200, the absorption portion 300, and the ultrasonic wave amplifying unit 400 may have a concentric axis and may be arranged along the central axis.

In the following description, one element or feature's relationship to other element(s) or feature(s) is based on a direction from the absorption portion 300 to the ultrasonic wave amplifying unit 400 for convenience of description. For example, a surface of the absorption portion 300 facing the ultrasonic wave amplifying unit 400 is a "front surface", and a direction from the absorption portion 300 to the ultrasonic wave amplifying unit 400 is a "forward direction". In addition, a surface of the ultrasonic wave amplifying unit 400 facing the absorption portion 300 is a "back surface", and a direction from the ultrasonic wave amplifying unit 400 to the absorption portion 300 is a "backward direction".

Specifically, the ultrasonic vibration portion 100 may generate ultrasonic waves. The ultrasonic vibration portion 100 may be an active element, for example, a piezoelectric element.

The matching layer 200 may be disposed on a front surface of the ultrasonic vibration portion 100 and may radiate the ultrasonic waves generated by the ultrasonic vibration portion 100 in a forward direction.

When the ultrasonic vibration portion 100 is a piezoelectric element, the thickness of the matching layer 200 may be varied depending on the operational wavelength of ultrasonic waves generated by the piezoelectric element. For example, when the operational wavelength is $\lambda$, the matching layer 200 may have a thickness of $\lambda/4$. The matching layer 200 may correspond in shape to the piezoelectric element.

The matching layer 200 may reduce a difference in impedance between the ultrasonic vibration portion 100 and air and may promote penetration of ultrasonic waves.

The absorption portion 300 may be disposed on a back surface of the ultrasonic vibration portion 100. The absorption portion 300 serves as a damper absorbing the ultrasonic waves generated by the ultrasonic vibration portion 100 to suppress vibration at the rear of the ultrasonic vibration portion 100.

The absorption portion 300 removes the ultrasonic waves transferred to the absorption portion 300 by scattering or absorbing the ultrasonic waves so as to avoid unnecessary signal interference, thereby allowing increase in resolution and increase in frequency bandwidth.

The ultrasonic wave amplifying unit 400 may be disposed on a front surface of the matching layer 200. The ultrasonic wave amplifying unit 400 may be configured to have a first resonant frequency identical to the operational frequency of the ultrasonic waves radiated from the matching layer 200.

When ultrasonic waves having an operational frequency identical to the first resonant frequency are applied to the ultrasonic wave amplifying unit 400 having the first resonant frequency, a resonance can be generated in the ultrasonic wave amplifying unit 400, causing amplification of the ultrasonic waves and thus increase in ultrasonic power in air.

The ultrasonic wave amplifying unit 400 may be disposed in front of an ultrasonic wave generator generating ultrasonic waves, for example, the ultrasonic vibration portion 100, or in front of a transfer medium transferring ultrasonic waves, for example, the matching layer 200.

Since the matching layer 200 is disposed in front of the ultrasonic vibration portion 100 and the ultrasonic wave amplifying unit 400 is disposed in front of the matching layer 200 in this embodiment, the present invention will be described with reference to an example in which the ultrasonic wave amplifying unit 400 is disposed in front of a transfer medium transferring ultrasonic waves, for example, the matching layer 200.

Figure 3:
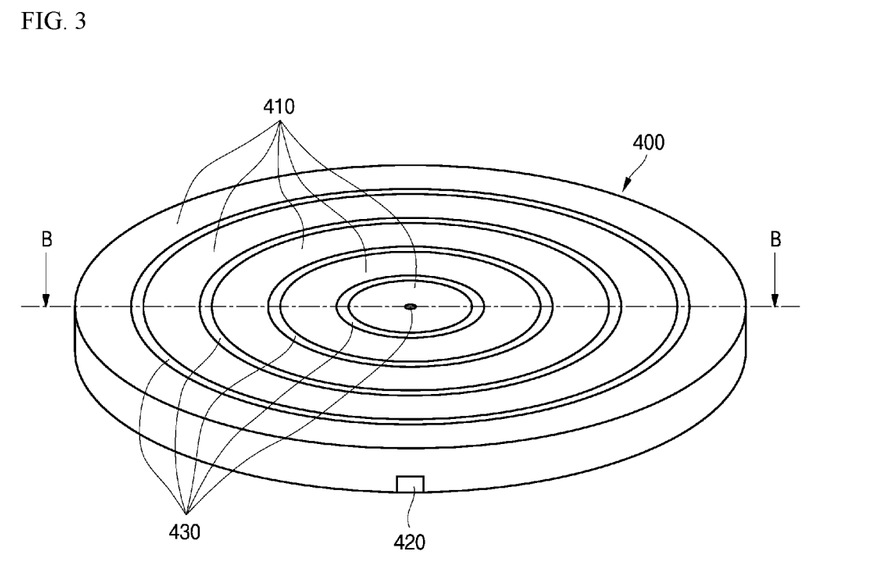
FIG. 3 is a perspective view of an ultrasonic wave amplifying unit of the non-contact ultrasonic transducer according to the embodiment.
Figure 4:
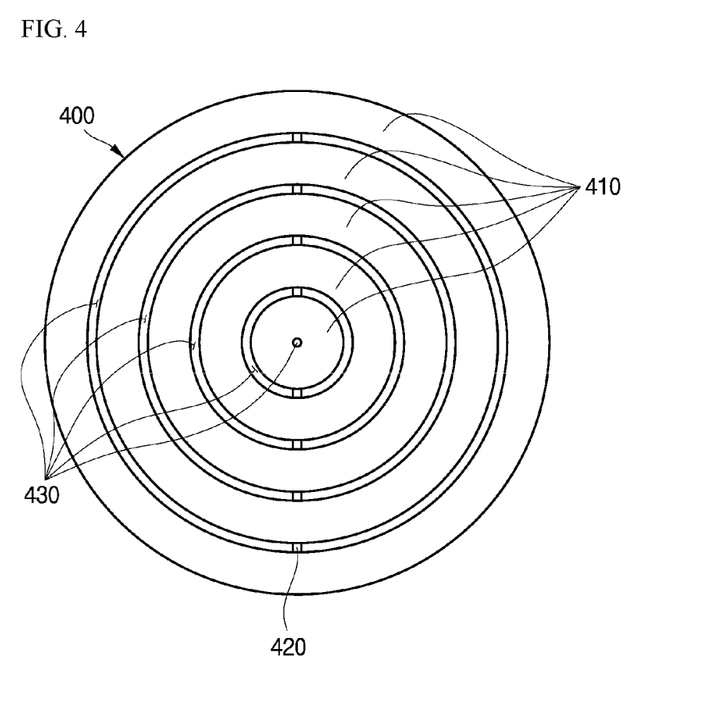
FIG. 4 is a plan view of the ultrasonic wave amplifying unit of the non-contact ultrasonic transducer according to the embodiment.
Figure 5:
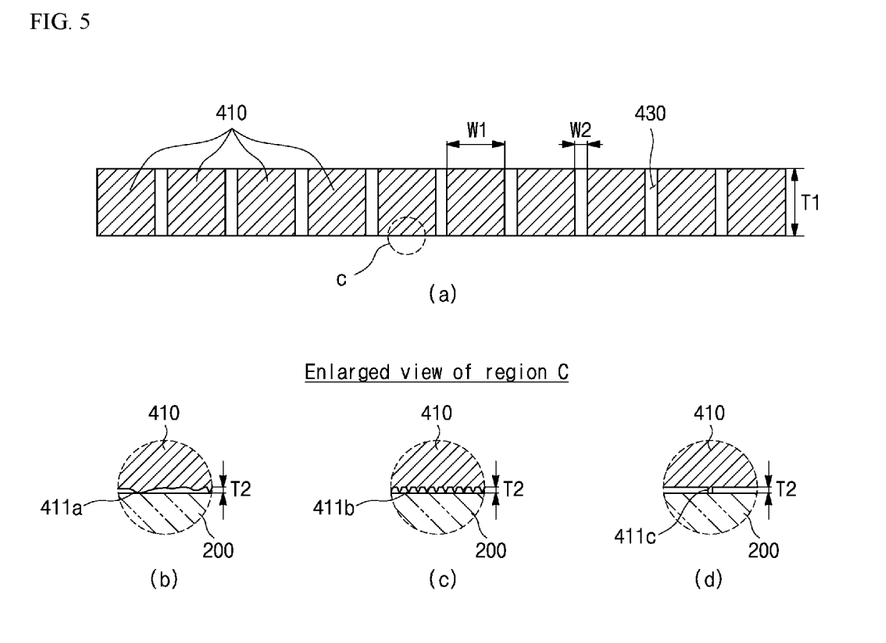
FIG. 5 is a sectional view taken along line B-B of FIG. 3.
Figure 6:
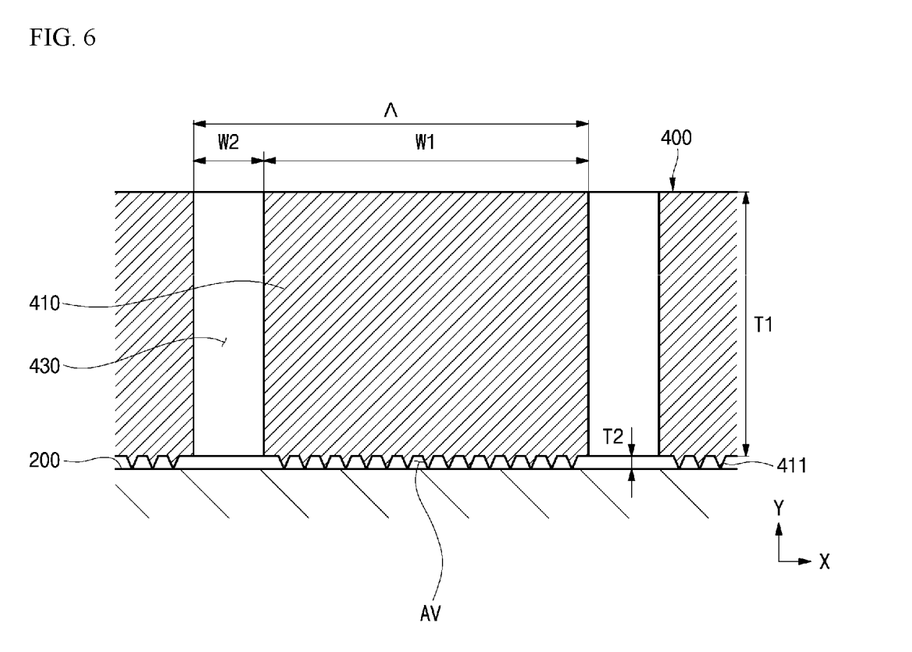
FIG. 6 is a view illustrating an exemplary operation of the ultrasonic wave amplifying unit of the non-contact ultrasonic transducer according to the embodiment.

FIG. 3 is a perspective view of the ultrasonic wave amplifying unit of the non-contact ultrasonic transducer according to the embodiment, FIG. 4 is a plan view of the ultrasonic wave amplifying unit of the non-contact ultrasonic transducer according to the embodiment, FIG. 5 is a sectional view taken along line B-B of FIG. 3, and FIG. 6 is a view illustrating an exemplary operation of the ultrasonic wave amplifying unit of the non-contact ultrasonic transducer according to the embodiment. Now, the present invention will be described with further reference to FIG. 3 to FIG. 6.

Referring to FIG. 3 to FIG. 6, the ultrasonic wave amplifying unit 400 may include multiple rings 410 and a connection bar 420.

The multiple rings 410 may have a concentric axis. Each of the rings 410 may have a first width W1 and may have the same thickness T1.

A slit 430 may be formed between a pair of adjacent rings 410. The slit 430 may have a second width W2 corresponding to a distance between the pair of adjacent rings 410. That is, each of the rings 410 may be separated from adjacent rings by a distance corresponding to the second width W2.

The second width W2 may be less than $\lambda/10$ and may be less than ⅕ of the first width W1.

The connection bar 420 connects the multiple rings 410 to one another to keep each of the rings 410 separated the second width W2 from adjacent rings.

The width of the connection bar 420 is appropriately adjusted such that the connection bar 420 is rigid enough to secure each of the rings 410 thereto while minimizing the cross-sectional area of the slit 430 which is covered by the connection bar 420.

In addition, the connection bar 420 may extend in a diametrical direction of each of the rings 410 such that the multiple rings 410 can be coupled and secured to one connection bar 420.

Each of the rings 410 may have a spacer protruding from a back surface thereof facing the matching layer 200.

The spacer may tightly contact the front surface of the matching layer 200. Accordingly, the back surface of each of the rings 410 is spaced apart from the front surface of the matching layer 200, whereby an air layer AV can be formed between the back surface of each of the rings 410 and the front surface of the matching layer 200. The air layer AV may form a new impedance layer.

The spacer may be provided in the form of a natural spacer 411a resulting from the texture or surface roughness of a material of the ring 410, as shown in FIG. 5(b).

Alternatively, the spacer may be an artificial structure and may be provided in the form of multiple spacers 411b densely formed on the surface of the ring 410, as shown in FIG. 5(c), or in the form of a single spacer 411c formed on the surface of the ring 410, as shown in FIG. 5(d).

For convenience of description, the present invention will now be described with reference to an example in which the spacer is provided in the form of multiple spacers 411b.

A protrusion height T2 of each of the spacers 411b may be less than $\lambda/100$. The protrusion height T2 of each of the spacers 411b may be smaller than the second width W2 of the slit 430.

Although the connection bar 420 is shown as disposed at a rear end of each of the rings 410, it will be understood that the present invention is not limited thereto and the connection bar 420 may be disposed at a front end of each of the rings 410.

When the connection bar 420 is disposed at the rear end of each of the rings 410, the connection bar 420 may be coupled to the rings 410 such that a back surface of the connection bar 420 is flush with the back surface of each of the rings 410. In this case, the connection bar 420 may be formed on the back surface thereof with spacers having the same shape as the spacers 411b formed on each of the rings 410.

The ultrasonic wave amplifying unit 400 may be integrally formed with the matching layer 200. However, it will be understood that the present invention is not limited thereto and the ultrasonic wave amplifying unit 400 may be fabricated separately and assembled afterwards.

When the ultrasonic wave amplifying unit 400 is fabricated separately and assembled afterwards, the ultrasonic wave amplifying unit 400 may be connected to an existing commercially available non-contact ultrasonic transducer. In addition, the ultrasonic wave amplifying unit 400 may be detachably connected to an existing non-contact ultrasonic transducer and may be designed to fit the shape of an existing non-contact ultrasonic transducer.

Figure 7:
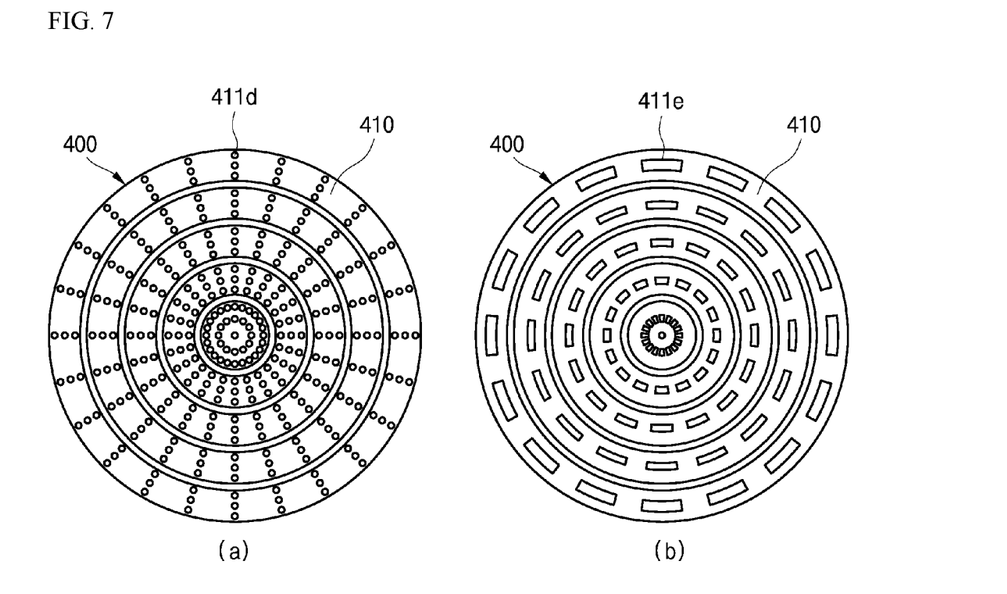
FIG. 7 is a view of a spacer of the ultrasonic wave amplifying unit of the non-contact ultrasonic transducer according to the embodiment.

FIG. 7 is a view of exemplary spacers of the ultrasonic wave amplifying unit of the non-contact ultrasonic transducer according to the embodiment.

Each of the rings 410 may have multiple spacers 411d radially arranged thereon, as shown in FIG. 7(a). However, it will be understood that the arrangement and shape of spacers formed on the ring are not limited thereto.

For example, each of the rings 410 may have multiple spacers 411e circumferentially extending thereon and arranged at predetermined intervals, as shown in FIG. 7(b).

Figure 8:
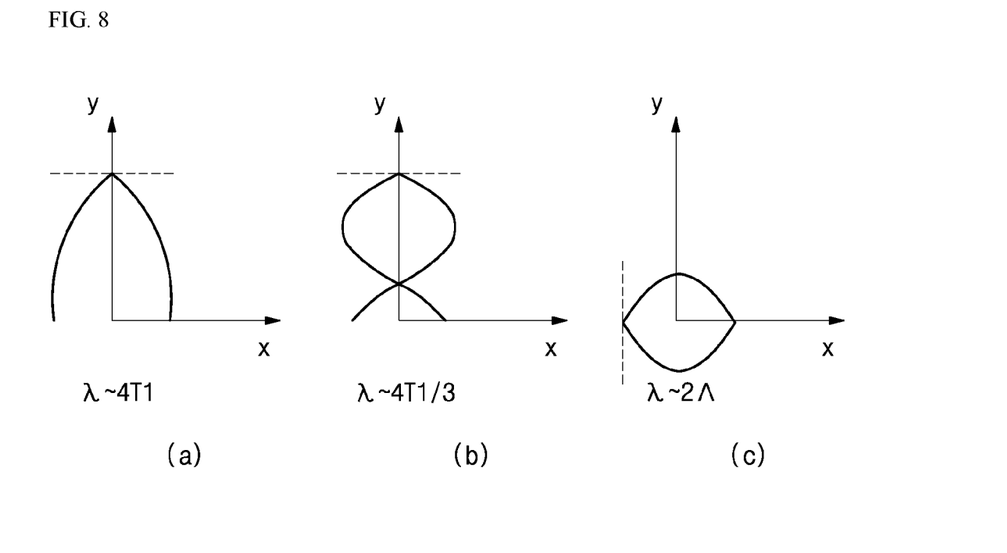
FIG. 8 is a view illustrating generation of a resonant frequency in the non-contact ultrasonic transducer according to the embodiment.

FIG. 8 is a view illustrating generation of a resonant frequency in the non-contact ultrasonic transducer according to the embodiment. FIG. 8(a) and FIG. 8(b) show a resonance in the slit 430 and FIG. 8(c) shows a resonance in the air layer AV.

Referring to FIG. 6 and FIG. 8, the first resonant frequency of the ultrasonic wave amplifying unit 400 may depend on the second width W2 of the slit 430, the first width W1 of the ring 410, and the height of the spacer T2. That is, resonance of sound waves in the slit 410 occurs under the condition that the silt forms a tube having an acoustically closed structure, and the air layer AV formed by the spacer 411b can also influence the resonance of sound waves.

The ultrasonic wave amplifying unit 400 may have a structure period A equal to the sum of the first width W1 of the ring 410 and the second width W2 of the slit 430. Since the structural period A is smaller than the wavelength of ultrasonic waves, an evanescent wave can be generated due to occurrence of higher order modes. As a result, an additional acoustic reactance can be generated. Radiation impedance responding to a periodic structure and an external environment due to the additional reactance may be expressed by Equation 1 according to Bloch's theorem.

$$Z_R = \frac{\rho c}{\Lambda}\left[1 + \sum_{n \neq 0} \frac{1}{\sqrt{1-\left(\frac{n\lambda}{\Lambda}\right)^2}}\left(\frac{\sin(\pi n \epsilon)}{\pi n \epsilon}\right)^2\right], \quad \text{[Equation 1]}$$

where $\rho$ denotes a density of air, c denotes a velocity of air, $\Lambda$ denotes a structure period, $\epsilon = W2/\Lambda$, and n denotes an integer.

In addition, a relation between acoustic parameters in the periodic slit 430 of the ultrasonic wave amplifying unit 400 may be expressed by Equation 2, which is a wave propagation equation in a waveguide.

$$\begin{bmatrix} p_{in} \\ p_{out} \end{bmatrix} = \begin{bmatrix} \frac{i\rho c}{W2}\frac{\cos(kl)}{\sin(kl)} & \frac{i\rho c}{W2}\frac{1}{\sin(kl)} \\ \frac{i\rho c}{W2}\frac{1}{\sin(kl)} & \frac{i\rho c}{W2}\frac{\cos(kl)}{\sin(kl)} \end{bmatrix} \begin{bmatrix} U_{in} \\ U_{out} \end{bmatrix}, \quad \text{[Equation 2]}$$

where $P_{in}$ denotes a sound pressure at the front end of the slit 430, $U_{in}$ denotes a sound velocity at the front end of the slit 430, $P_{out}$ denotes a sound pressure at the rear end of the slit 430 at which the slit meets the spacer 411b, $U_{out}$ denotes a sound velocity at the rear end of the slit 430 where the slit meets the spacer 411b, and i denotes a complex number representing SQRT(−1). In addition, k denotes a wavenumber, which means $\omega/c$, where $\omega = 2\lambda f$, f denotes a frequency, and c denotes a velocity of air in the slit.

Acoustic impedance formed at a bottom of the slit 430 by the ring 410 and the slit 430, which are periodic structures, and the air layer AV formed by the spacer 411b may be expressed by Equation 3.

$$Z_g = -\frac{i\rho c}{\Lambda}\left[\sum_{n \neq 0}\left(\cot\left(\frac{2\pi \cdot T2}{x}\right) - \frac{1 + \exp\left(2-\sqrt{(Zn\pi \cdot T2)^2-\left(\frac{2\pi \cdot T2}{x}\right)^2}\right)}{1 - \exp\left(2-\sqrt{(Zn\pi \cdot T2)^2-\left(\frac{2\pi \cdot T2}{x}\right)^2}\right)}\right)\frac{1}{\sqrt{1-(nx)^2}}\left(\frac{\sin(\pi n)}{\pi n \in}\right)^2\right], \quad \text{[Equation 3]}$$

where $x = \lambda/\Lambda$.

Physically, conditions of an acoustic resonance in the slit 430 may be given by $\lambda \sim (4 \times T1)/n$ (n=1, 3, 5, 7, 9, ...). Here, T1 denotes the thickness of the ring 410 and the thickness of the slit 430.

In addition, a circumferential resonance may occur due to the air layer AV formed between the matching layer 200 and the ring 410.

In particular, since the rings 410 having a circular shape are periodically arranged, when sound passes through the periodic structure, sound waves meet one another at the boundary between two symmetric planes. As a result, there can be a point at which a velocity gradient is zero. Accordingly, under new hard-wall boundary conditions, a resonant frequency may be generated by the air layer AV, which is much smaller than a wavelength formed inside the air layer AV. Here, the wavelength of the resonant frequency formed in the air layer AV may depend on the structure period and a gap defined by the spacer.

Actually, a sound pressure gradient distribution at the ultrasonic impedance boundary may depend on a resonance due to the slit 430 and a resonance due to the air layer AV formed by the spacer 411b. That is, the sound pressure gradient distribution at the impedance boundary may be obtained based on the resonances. In other words, the ultrasonic wave amplifying unit 400 according to this embodiment may achieve ultrasonic amplification using both the resonance due to the slit 430 and the resonance due to the air layer AV.

Resonant frequency of the resonance occurring in the air layer AV formed by the spacer 411b may be obtained from Equation 3. As can be seen from Equation 3, acoustic impedance formed in the air layer AV may be composed of two terms. The first term may represent compliance due to the presence of the air layer formed by the spacer 411b, and the second term may represent an acoustic mass or inductance of higher order modes. Actually, when $Z_g=0$ is satisfied, it is possible to find conditions of the resonance due to the air layer AV formed by the spacer 411b. Specifically, the conditions can be satisfied under conditions of $\lambda \sim 2\Lambda$.

Figure 9:
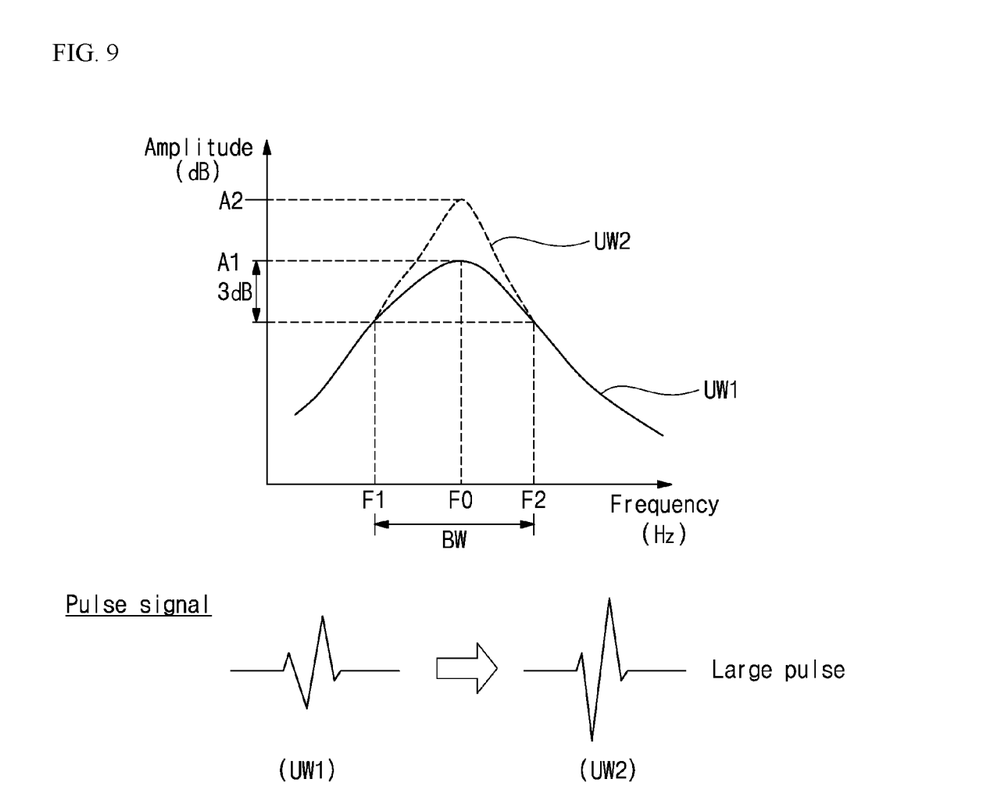
FIG. 9 is a graph illustrating ultrasonic amplification in the non-contact ultrasonic transducer according to the embodiment.

FIG. 9 is a graph illustrating ultrasonic amplification of the non-contact ultrasonic transducer according to the embodiment.

Referring to FIG. 9, when an ultrasonic wave UW1 generated by the ultrasonic vibration portion 100 and radiated from the matching layer 200 has, for example, an operational frequency having a half power (−3 dB) bandwidth BW having a central frequency of F0 and ranging from a first frequency F1 and a second frequency F2 and the ultrasonic wave amplifying unit 400 is configured to have a first resonant frequency identical to the operational frequency through adjustment of the second width W2 of the slit 430, the protrusion height T2 of the spacer 411, and the thickness T1 of the ring 410, an ultrasonic wave UW2 having an increased amplitude (from a first amplitude A1 to a second amplitude A2) can be radiated by the ultrasonic wave amplifying unit 400 upon application of the ultrasonic wave UW1 from the matching layer 200 to the ultrasonic wave amplifying unit 400.

When an external pulse signal is applied to the non-contact ultrasonic transducer, the non-contact ultrasonic transducer can more effectively increase the intensity of the pulse signal than existing non-contact ultrasonic transducers due to acoustic signal characteristics of the ultrasonic device having improved sensitivity.

Figure 10:
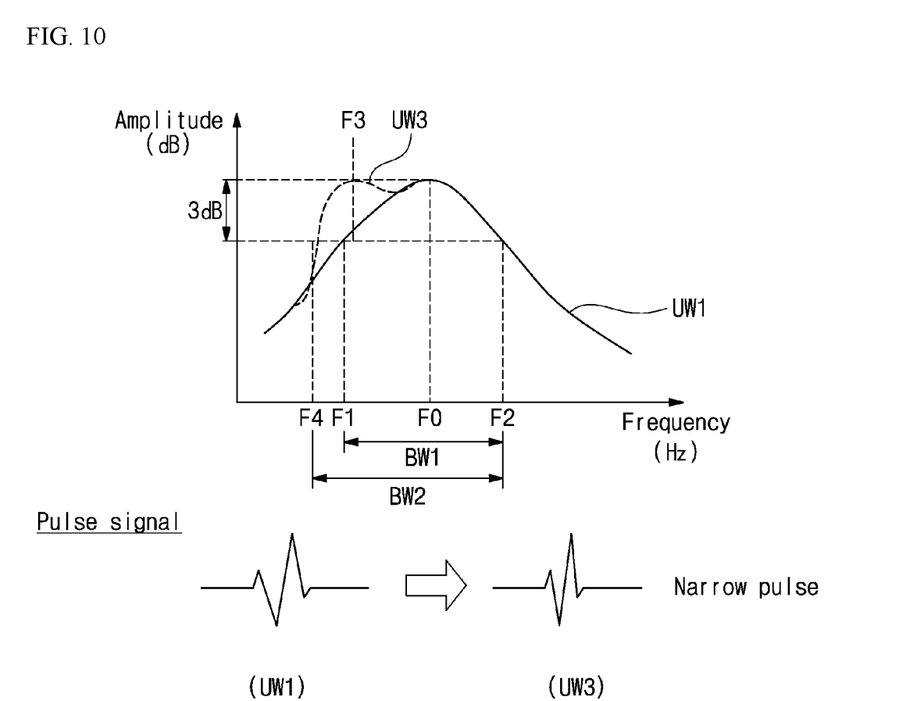
FIG. 10 is a graph illustrating generation of a broadband frequency in the non-contact ultrasonic transducer according to the embodiment.

FIG. 10 is a view illustrating generation of a broadband frequency in the non-contact ultrasonic transducer according to the embodiment.

Referring to FIG. 10, when the ultrasonic wave amplifying unit 400 is configured to have a second resonant frequency UW3 slightly different from the operational frequency UW1 through adjustment of the second width W2 of the slit 430, the protrusion height T2 of the spacer 411b, and the thickness T1 of the ring 410, that is, when a second resonant frequency UW3 having a central frequency F3 different from the central frequency F0 of the operational frequency UW1 is formed, a broadband frequency having a second bandwidth BW2 ranging from the second frequency F2 and a third frequency F4 can be formed through coupling between the operational frequency UW1 and the second resonant frequency UW3. The second bandwidth BW2 may be larger than the first bandwidth BW1 of the operational frequency UW1, which ranges from the first frequency F1 to the second frequency F2. That is, a broadband ultrasonic wave can be generated through coupling between the operational frequency UW1 and the second resonant frequency UW3.

In this way, a broadband sensor capable of covering a much broader frequency band than existing non-contact ultrasonic transducers can be implemented. That is, it is possible to reduce the pulse width of the operational frequency of the ultrasonic waves radiated from the matching layer 200. In other words, ultrasonic signals can be modified to have a second pulse width smaller than a first pulse width of the operational frequency.

The non-contact ultrasonic transducer may further include a casing 500 and a clamping portion 600.

The casing 500 may surround outer peripheral surfaces of the ultrasonic vibration portion 100 and the matching layer 200. The casing 500 may tightly contact the outer peripheral surfaces of the ultrasonic vibration portion 100 and the matching layer 200 to secure the ultrasonic vibration portion 100 and the matching layer 200.

The casing 500 may further surround the absorption portion 300.

The casing 500 may be connected at a rear end thereof to a cable 710 containing a transmission line (not shown) adapted to transmit electric power and a control signal to the ultrasonic vibration portion 100 therethrough and a signal line (not shown) of a connector (not shown) which is connected to the ultrasonic vibration portion 100 to transmit and receive electrical signals to and from the ultrasonic vibration portion 100.

A front end of the casing 500 may tightly contact the back surface of the ultrasonic wave amplifying unit 400.

The clamping portion 600 may have a housing 610 and a flange 620.

The housing 610 may surround an outer peripheral surface of the casing 500. The housing 610 may be tightly coupled to the casing 500.

The flange 620 may extend from a front end of the housing 610 toward a center of the housing 610. The flange 620 may tightly contact a front edge of the ultrasonic wave amplifying unit 400 and may press the amplification part 400 against the matching layer 200 such that the ultrasonic wave amplifying unit 400 can be tightly secured to the matching layer 200.

Although each of the rings 410 is shown as having a circular shape, it will be understood that the present invention is not limited thereto and each of the rings 410 may have a rectangular shape. When each of the rings 410 has a rectangular shape, each of the matching layer 200, the ultrasonic vibration portion 100, the absorption portion 300, the casing 500, and the clamping portion 600 may also have a rectangular cross-section.

Figure 11:
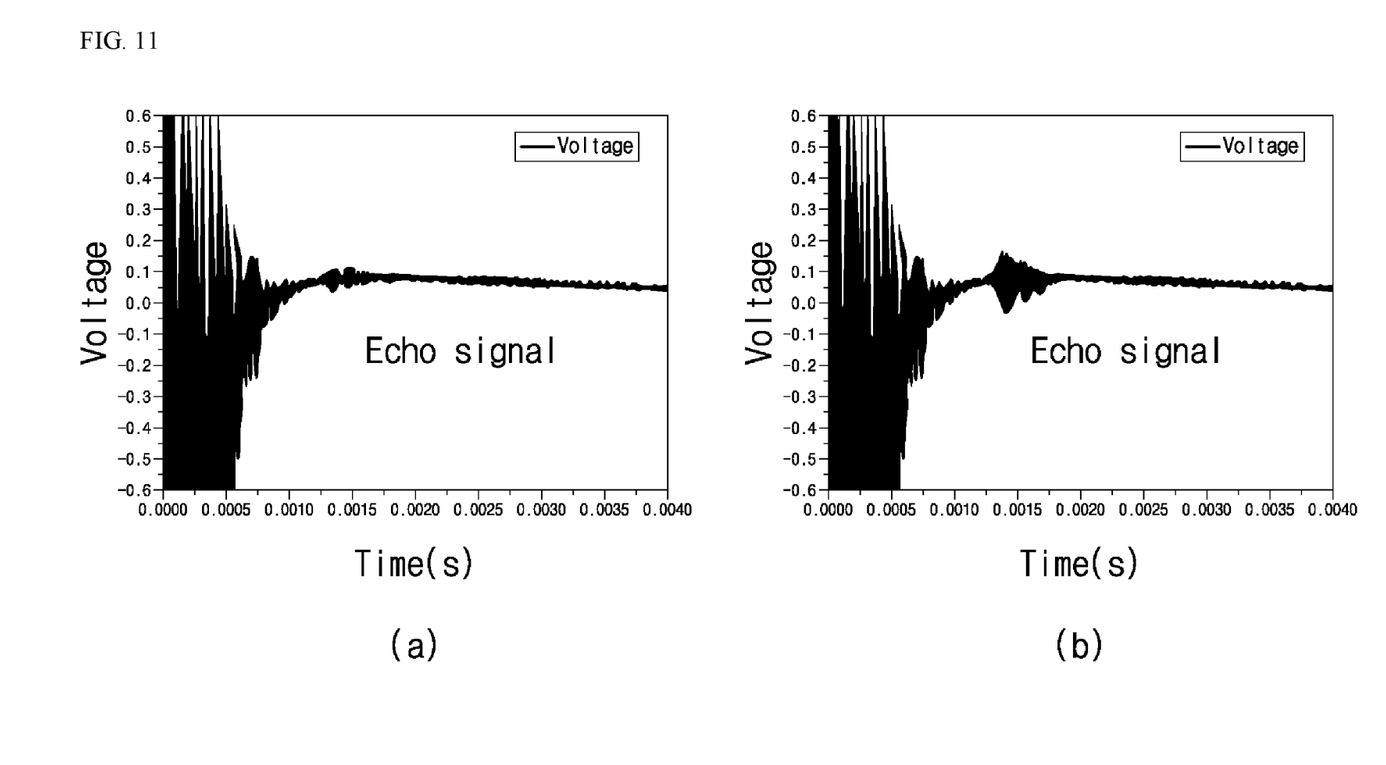
FIG. 11 shows graphs illustrating pulse-echoes of the non-contact ultrasonic transducer according to the embodiment and an existing non-contact ultrasonic transducer.

FIG. 11 shows graphs illustrating pulse-echoes detected by the non-contact ultrasonic transducer according to the embodiment of the present invention and an existing non-contact ultrasonic transducer. FIG. 11 shows a 50 kHz pulse-echo signal detected by each of the non-contact ultrasonic transducers, which was received from a reflector after radiating a 50 kHz ultrasonic wave to the reflector and then analyzed using a pulse receiver.

FIG. 11(a) shows a pulse-echo signal detected by an existing non-contact ultrasonic transducer without the ultrasonic wave amplifying unit 400, and FIG. 11(b) shows a pulse-echo signal detected by the non-contact ultrasonic transducer according to the present invention including the ultrasonic wave amplifying unit 400 under the same conditions as in FIG. 11(a). The existing non-contact ultrasonic transducer without the ultrasonic wave amplifying unit 400 exhibited a small magnitude of voltage fluctuation near 0.0015 sec, as shown in FIG. 11(a), whereas the non-contact ultrasonic transducer according to the present invention including the ultrasonic wave amplifying unit 400 exhibited a relatively large magnitude of voltage fluctuation near 0.0015 sec, as shown in FIG. 11(b). Thereby, it can be seen that the intensity of echo signals can be increased using the ultrasonic wave amplifying unit 400.

Figure 12:
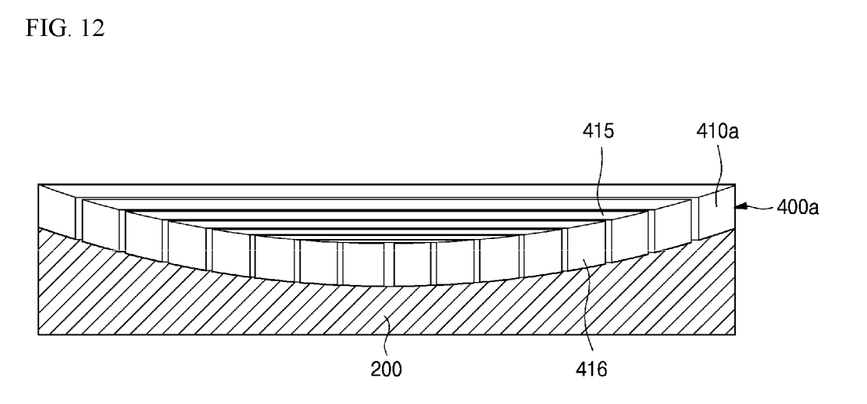
FIG. 12 is a view of an ultrasonic wave amplifying unit of a non-contact ultrasonic transducer according to another embodiment of the present invention.

FIG. 12 is a schematic view of an ultrasonic wave amplifying unit of a non-contact ultrasonic transducer according to another embodiment of the present invention. The non-contact ultrasonic transducer according to this embodiment is different from the non-contact ultrasonic transducer according to the above embodiment in that the ultrasonic wave amplifying unit has a different shape. Since the other configurations are the same as those in the above embodiment, description thereof will be omitted.

Referring to FIG. 12, front surfaces of rings 410a of an ultrasonic wave amplifying unit 400a may form a continuous concave surface 415. In this way, ultrasonic waves amplified and radiated by the ultrasonic wave amplifying unit 400a can be concentrated on a first point P in front of the ultrasonic wave amplifying unit 400a.

The rings 410a may have the same height. Accordingly, the back surfaces of the rings 410a may form a continuous convex surface 416.

In addition, in this embodiment, the front surface of the matching layer may be formed to correspond to the convex surface 416. In this way, the air layer between the ultrasonic wave amplifying unit 400a and the matching layer can have a uniform thickness.

The convex surface 416 may be formed to correspond to the concave surface 415. Accordingly, the front surface of the matching layer may have the same shape as the front surface of the ultrasonic wave amplifying unit 400a.

Although some embodiments have been described herein, it will be understood that various modifications, changes, alterations, and equivalent embodiments can be made by those skilled in the art without departing from the spirit and scope of the invention. Therefore, it will be understood that these embodiments are provided for illustration only and are not to be construed in any way as limiting the present invention. For example, components described as implemented separately may also be implemented in combined form, and vice versa.

The scope of the present invention is indicated by the following claims, and all changes or modifications derived from the meaning and scope of the claims and equivalents thereto should be construed as being included in the scope of the present invention.

INDUSTRIAL APPLICABILITY

The present invention may be used in the field of ultrasonic inspection technology that provides information necessary for inspection of a subject by applying ultrasonic waves to the subject, followed by detection of echo signals reflected from the subject.

The invention claimed is:

1. An ultrasonic wave amplifying unit comprising
multiple rings having a concentric axis and each having a first width,
wherein a slit having a second width is formed between the rings, and
an air layer is formed between the multiple rings and an ultrasonic wave generator generating ultrasonic waves or a transfer medium transferring the ultrasonic waves, whereby ultrasonic amplification is achieved using both resonance occurring due to the slit and resonance occurring due to the air layer,
wherein the ultrasonic wave amplifying unit is configured to have a second resonant frequency different from an operational frequency of the ultrasonic waves, whereby, through coupling between the operational frequency and the second resonant frequency, a broadband ultrasonic wave having a second bandwidth larger than a first bandwidth of the operational frequency is formed and the ultrasonic waves are modified to have a second pulse width smaller than a first pulse width of the operational frequency.

2. The ultrasonic wave amplifying unit according to claim 1, further comprising:
a connection bar extending in a diametrical direction of the multiple rings to connect the multiple rings to one another.

3. The ultrasonic wave amplifying unit according to claim 1, wherein each of the rings has a spacer protruding from a back surface thereof such that the rings are spaced apart from the ultrasonic wave generator or the transfer medium to form the air layer therebetween.

4. The ultrasonic wave amplifying unit according to claim 3, wherein the spacer comprises multiple spacers radially arranged on each of the rings.

5. The ultrasonic wave amplifying unit according to claim 3, wherein the spacer comprises multiple spacers circumferentially extending on each of the rings and arranged at predetermined intervals based on an operational frequency of the ultrasonic waves.

6. The ultrasonic wave amplifying unit according to claim 3, wherein a height of the spacer is less than $1/100$ of an operational wavelength ($\lambda$) of the ultrasonic waves.

7. The ultrasonic wave amplifying unit according to claim 1, wherein each of the rings has a circular shape or a rectangular shape.

8. The ultrasonic wave amplifying unit according to claim 1, wherein front surfaces of the multiple rings form a continuous concave surface and back surfaces of the multiple rings form a continuous convex surface such that the ultrasonic waves amplified and radiated by the ultrasonic wave amplifying unit are concentrated on a first point in front of the ultrasonic wave amplifying unit.

9. A non-contact ultrasonic transducer comprising:
an ultrasonic vibration portion generating ultrasonic waves;
a matching layer disposed on a front surface of the ultrasonic vibration portion and radiating the ultrasonic waves generated by the ultrasonic vibration portion in a forward direction thereof;
an absorption portion disposed on a back surface of the ultrasonic vibration portion and absorbing the ultrasonic waves generated by the ultrasonic vibration portion; and
the ultrasonic wave amplifying unit according to claim 1.

10. The non-contact ultrasonic transducer according to claim 9, further comprising:
a casing surrounding outer peripheral surfaces of the ultrasonic vibration portion and the matching layer and having a front end tightly contacting a back surface of the ultrasonic wave amplifying unit; and
a clamping portion comprising a housing surrounding an outer peripheral surface of the casing and a flange extending from a front end of the housing toward a center of the housing and tightly contacting a front edge of the ultrasonic wave amplifying unit to tightly secure the ultrasonic wave amplifying unit to the matching layer.

* * * * *